United States Patent [19]

Nakamura

[11] Patent Number: 5,418,661
[45] Date of Patent: May 23, 1995

[54] ACTIVE FILTER CHARACTERISTIC CHANGEOVER CIRCUIT FOR USE IN A VCR

[75] Inventor: Takeshi Nakamura, Kyoto, Japan

[73] Assignee: Rohm Co., Ltd., Kyoto, Japan

[21] Appl. No.: 272,648

[22] Filed: Jul. 11, 1994

Related U.S. Application Data

[63] Continuation of Ser. No. 874,461, Apr. 27, 1992, abandoned.

[30] Foreign Application Priority Data

Apr. 27, 1991 [JP] Japan .................................. 3-125088

[51] Int. Cl.6 ...................... G11B 5/035; G11B 15/12
[52] U.S. Cl. ......................................... 360/65; 360/61
[58] Field of Search ............... 360/27, 61, 65, 67, 360/68; 358/335; 375/103; 333/167, 174; 330/302, 303, 306

[56] References Cited

U.S. PATENT DOCUMENTS

| | | | |
|---|---|---|---|
| 4,340,868 | 7/1982 | Pace ..................................... | 330/294 |
| 4,514,704 | 4/1985 | Curtis ................................... | 330/305 |
| 4,786,986 | 11/1988 | Yamanushi et al. .................. | 360/27 |
| 4,796,101 | 1/1989 | Kupfer .................................. | 360/67 |
| 5,040,082 | 8/1991 | Moro et al. ........................... | 360/27 |
| 5,075,803 | 12/1991 | Moro et al. ........................... | 360/67 |
| 5,225,790 | 7/1993 | Noguchi et al. ...................... | 330/260 |

Primary Examiner—A. Psitos
Assistant Examiner—Won T. C. Kim
Attorney, Agent, or Firm—Nikaido, Marmelstein, Murray & Oram

[57] ABSTRACT

An active filter characteristic changeover circuit, for use in a video cassette recorder, includes an active filter, for a video signal, whose passing band width is dependent on a control current value, a current supply circuit for supplying a control current to the active filter, and a changeover circuit for changing over the control current value outputted from the current supply circuit between in a VHS mode and in an SVHS mode.

5 Claims, 7 Drawing Sheets

3,418,661

ACTIVE FILTER CHARACTERISTIC CHANGEOVER CIRCUIT FOR USE IN A VCR

This application is a continuation of application Ser. No. 07/874,461 filed Apr. 27, 1992, abandoned.

BACKGROUND OF THE INVENTION

1. Field of the Invention

The present invention relates to an active filter characteristic changeover circuit for use in a VCR (video cassette recorder), and more particularly, to a video signal active filter characteristic changeover circuit for use in a VCR having a VHF mode and a super VHS (SVHS) mode.

2. Description of the Prior Art

In an SVHS mode, since video signal over a higher frequency band can be recorded and reproduced than in a VHS mode, the passing frequency band of a luminance signal in a filter is from 0 to 5 MHz in the SVHS mode, and a frequency band wider than a frequency band of from 0 to 3 MHz used in the VHS mode is required.

In conventional VCRs, as shown in FIG. 1, two discrete filters having different characteristics are provided for the SVHS mode and the VHS mode, respectively, and these filters are changed over in response to a changeover of these modes. In FIG. 1, the numeral 2 filter for the VHS mode, represents a and the numeral 3 represents a filter for the SVHS mode. The numerals 1 and 4 represent switches provided on the input and output sides of the filters 2 and 3, respectively, and are changed over in synchronization with each other.

However, the conventional circuits where the filters are changed over in response to a changeover between the VHS and SVHS modes to change over a path of a luminance signal are disadvantageous, for example, in constructing the filters in the form of integrated circuit since two filters are required. That is, in constructing a filter in the form of integrated circuit, the filter generally occupies a large area of an integrated circuit. Therefore, if there are two filters, a larger area is occupied by the filters on a semiconductor integrated circuit chip. This makes it impossible to decrease the size and cost of the chip.

Moreover, by the conventional method where different filters are used for the VHS and SVHS modes, respectively, a problem arises that one path including one filter is offset against the other including the other filter with respect to signals passing through them.

SUMMARY OF THE INVENTION

An object of the present invention is to decrease the area occupied by a filter in an integrated circuit.

Another object of the present invention is to decrease the generation of an offset between the VHS and the SVHS modes.

To achieve the above-mentioned objects, an active filter characteristic changeover circuit of the present invention is provided with: an active filter, for a video signal, whose passing band width is dependent on a control current value; a current supply circuit for supplying a control current to said active filter; and a changeover circuit for changing over the control current value outputted from said current supply circuit between in a VHS mode and in an SVHS mode.

According to such a feature, since characteristics of an active filter is changed over by only changing over the value of a control current to be supplied to the active filter, substantially only one filter is required for both the VHS and SVHS modes. Therefore, if constructed in the form of integrated circuit, the filter occupies only a small area of an integrated circuit, and an offset between the VHS and SVHS modes are not generated in the filter.

BRIEF DESCRIPTION OF THE DRAWINGS

These and other objects and features of this invention will become clear from the following description taken in conjunction with the preferred embodiments with reference to the accompanied drawings in which.

DESCRIPTION OF THE PREFERRED EMBODIMENTS

Figure 1:
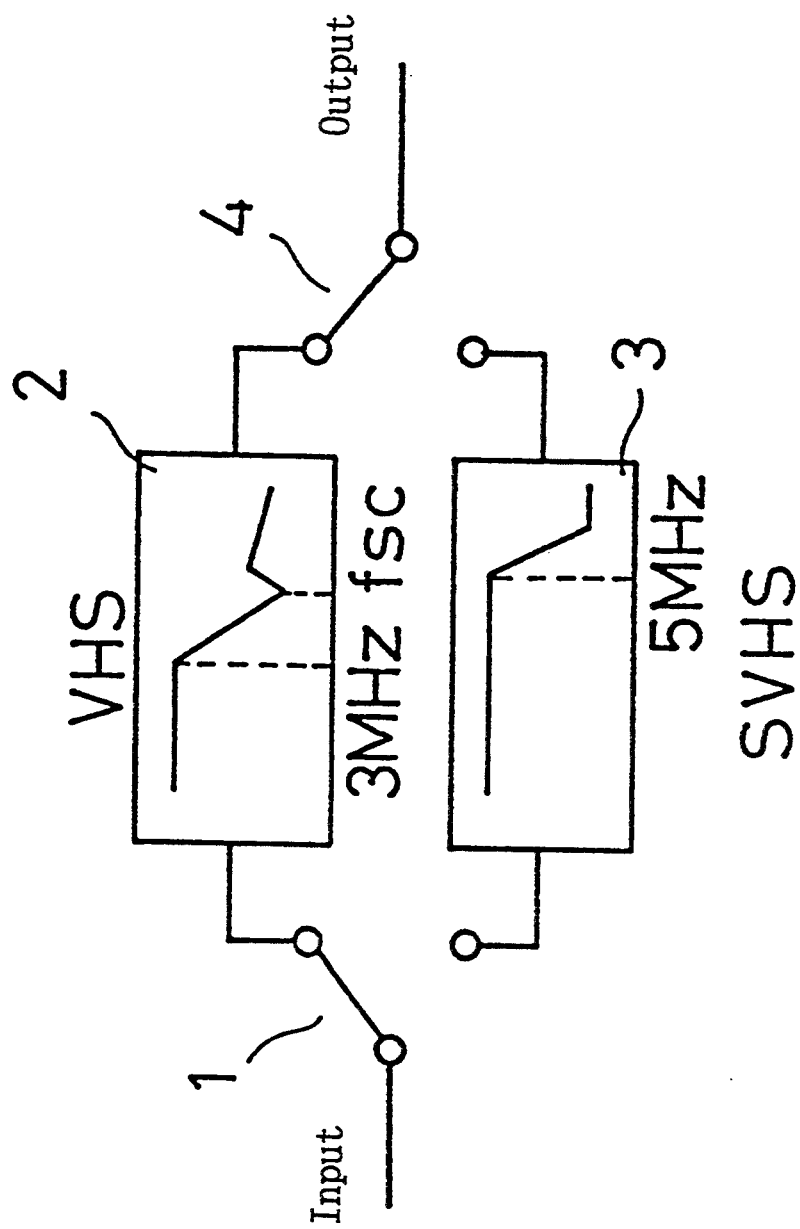
FIG. 1 is a block circuit diagram of a conventional filter characteristics changeover circuit for use in a VCR having a VHS mode and an SVHS mode.

The present invention will hereinafter be described with a description of an embodiment thereof shown in the drawings.

Figure 2:
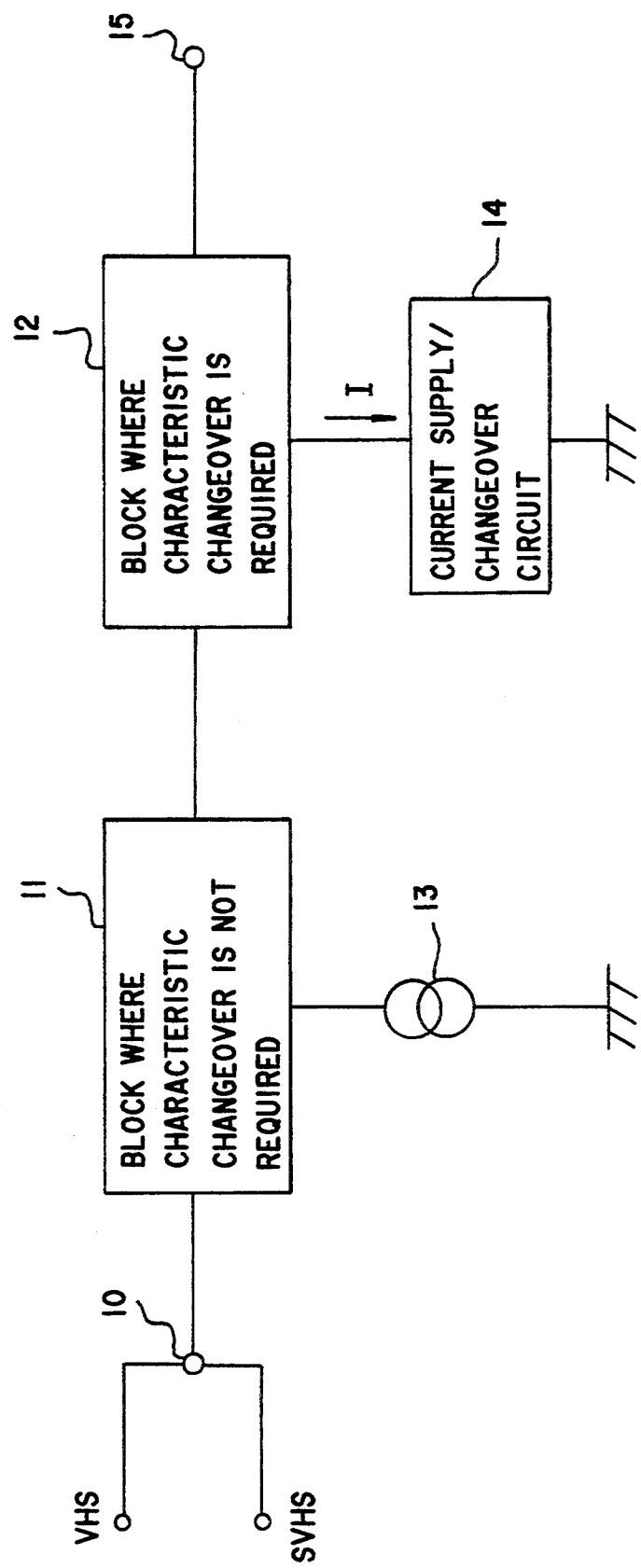
FIG. 2 is a block circuit diagram of a video signal active filter characteristic changeover circuit, for use in a VCR, embodying the present invention.

In an active filter shown in FIG. 2, the numeral 11 is a block where a changeover of characteristics between in the VHS mode and in the SVHS mode is not required, and the numeral 12 is a block where the changeover of characteristics is required. The numeral 14 is a block constituting a current supply/changeover circuit for changing over a current value to supply it to the block 12. The numeral 10 is an input terminal for video signals. The numeral 13 is a current source of the block 11. The numeral 15 is an output terminal.

Figure 3:
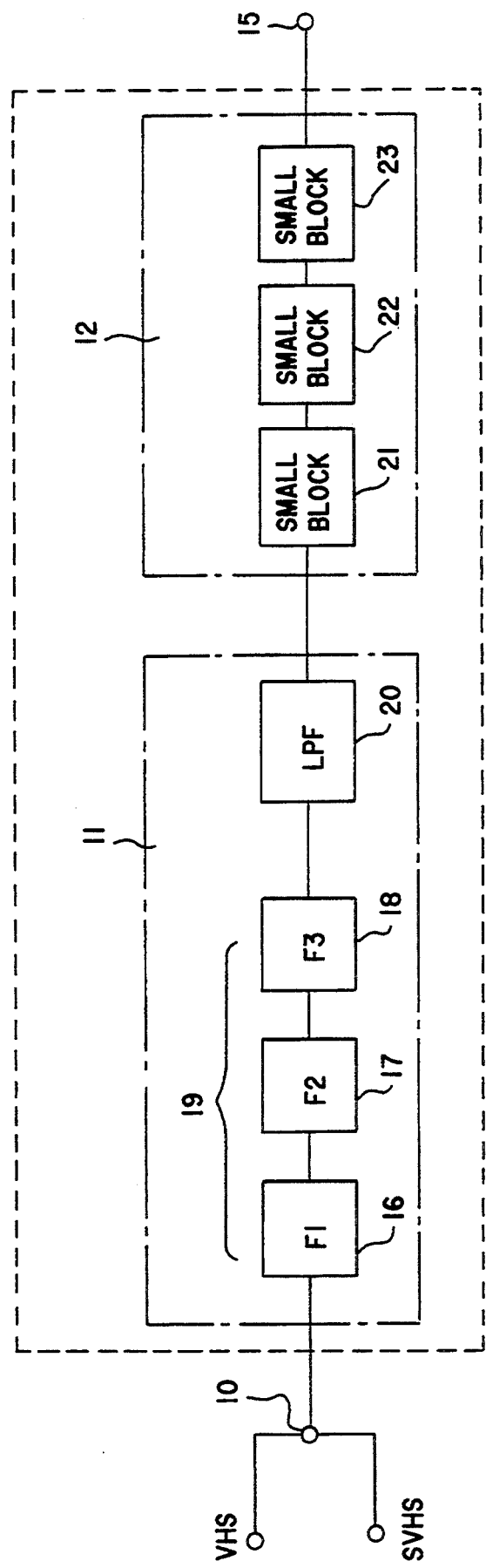
FIG. 3 is a block circuit diagram showing a part of the arrangement of the circuit of FIG. 2.
Figure 4A:
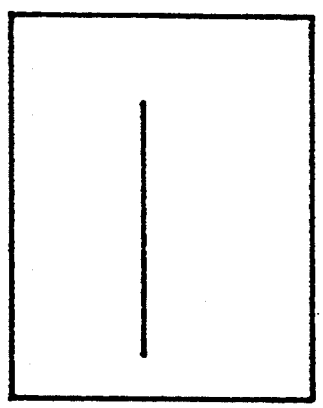
FIGS. 4A to 4C show frequency-to-gain characteristics of each portion of the circuit of FIG. 2.
Figure 4B:
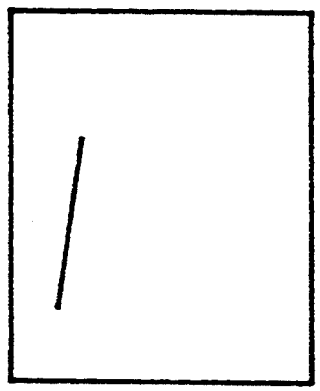
Figure 4C:
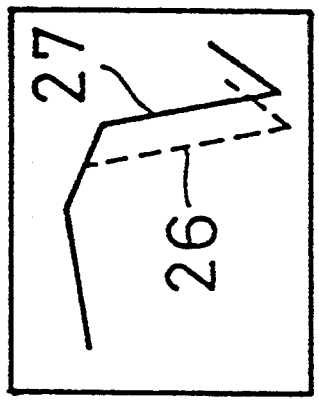

The block 11, as shown in FIG. 3, includes group delay circuit 19 having three filters 16, 17 and 18 with center frequencies of F1, F2 and F3 and a low pass filter 20. Color signals which pass through a color signal processing circuit (not shown) are generally delayed compared with luminance signals. The group delay circuit 19 is a circuit for delaying a luminance signal by a predetermined time so that the luminance signal coincides with a color signal in time. The group delay circuit 19 is designed so that the gain thereof does not change as shown in FIG. 4A since it is for only delaying luminance signals. The low pass filter 20 is provided for noise cancellation. The gain thereof descends toward high frequency side as shown in FIG. 4B. The current supply/changeover block 12, although other arrangements may be possible, is constituted by three small blocks 21 to 23. The small blocks 21 to 23 consist of filters. The general characteristics thereof are as shown in FIG. 4C.

Figure 5:
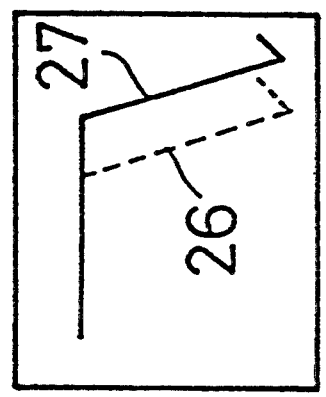
FIG. 5 shows a general frequency-to-gain characteristic of the circuit of FIG. 2.

The characteristics are changed over to those shown by a dotted line in the VHS mode and to those shown by a solid line 27 in the SVHS mode. The total characteristics of the blocks 11 and are shown in FIG. 5.

Figure 7:
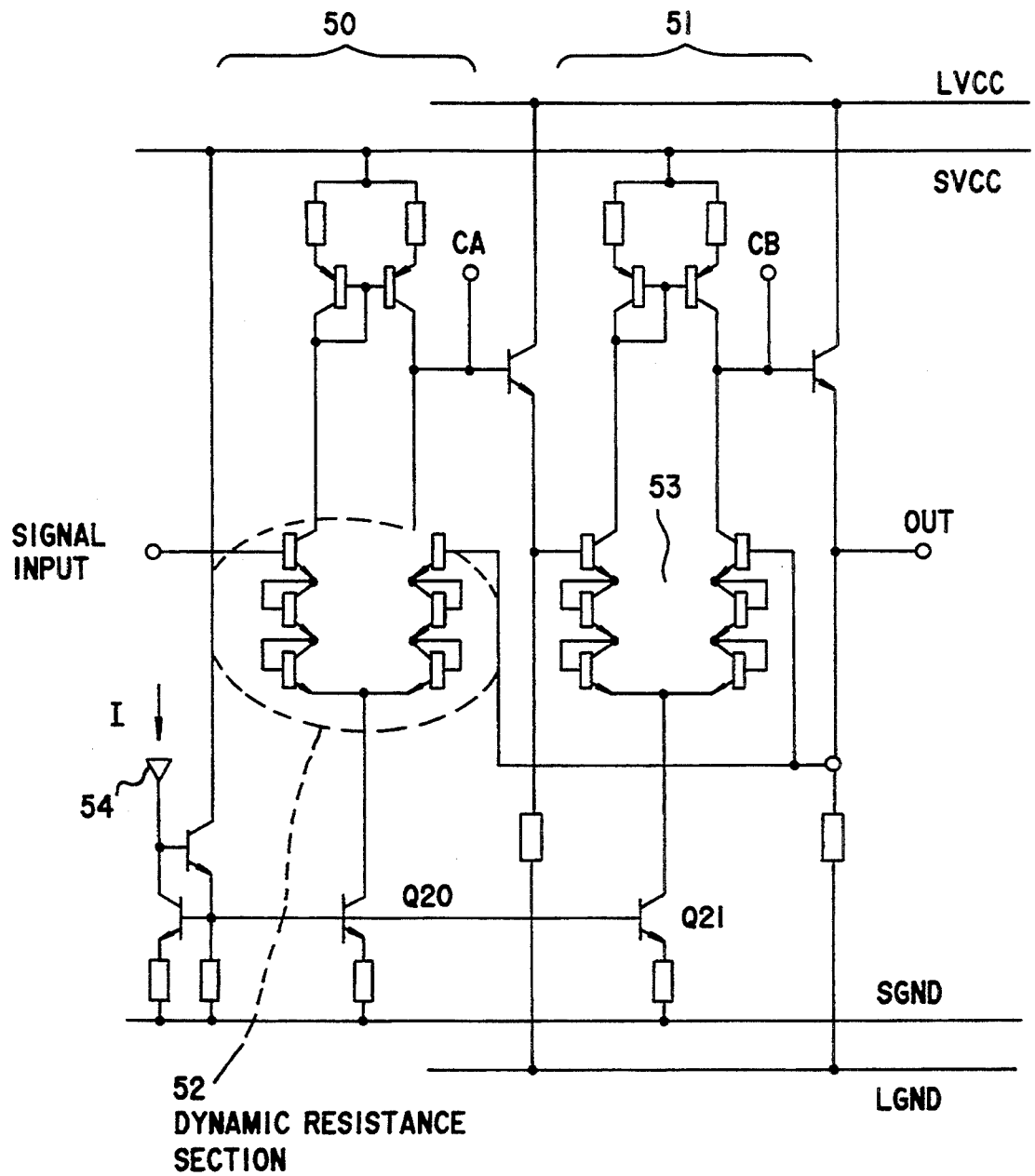
FIG. 7 is a detailed circuit diagram of an active filter of FIG. 2.

The small blocks 21 to 23 constituting the block 12 consist of circuits as shown in FIG. 7. In FIG. 7, the numerals 50 and 51 are conductance circuits utilizing dynamic resistance of transistors. The dynamic resistance is defined by $KT/qI_E$ wherein K, T, q, $I_E$ represent respectively Boltzmann constant, an absolute temperature, a charge and an emitter current. Between a terminal CA and an output terminal OUT, a first capacitor (not shown) is connected, while between a terminal CB and a ground line, a second capacitor (not shown) is connected. To a terminal 54, a current I is provided. Currents flowing through constant current sources Q20 and Q21 for differential transistors constituting dynamic resistance sections 52 and 53 are determined by the current I to be provided to the terminal 54. Thereby, a center frequency of the circuit of FIG. 7 is determined.

Figure 6:
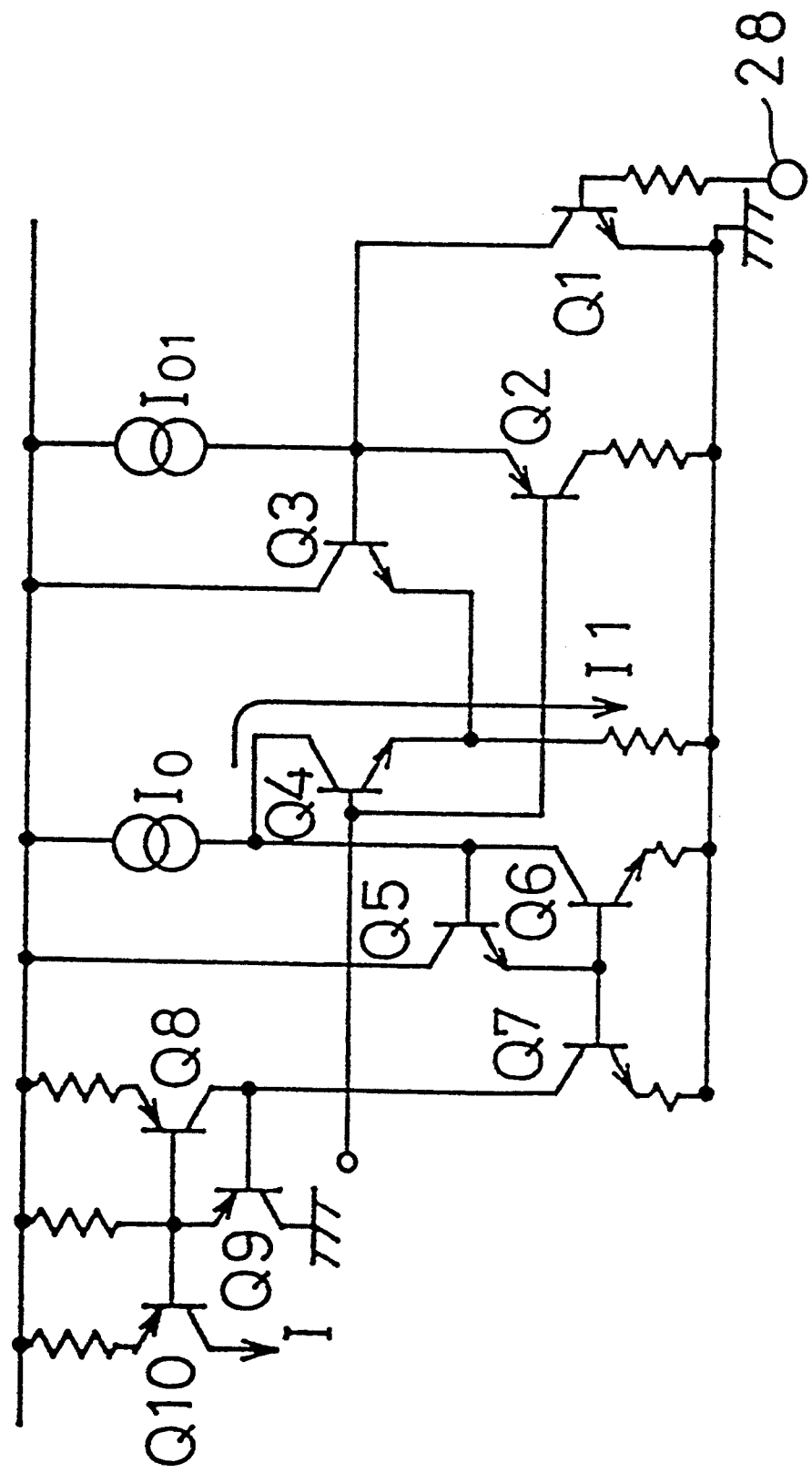
FIG. 6 is a detailed circuit diagram of a current supply/changeover circuit of FIG. 2.

The current supply/changeover block 14 is constructed as shown in FIG. 6. A changeover voltage is applied to a control terminal 28. The changeover voltage is 1.5 V in the VHS mode and 0V in the SVHS mode. Therefore, in the SVHS mode, a current Io flows through a transistor Q6 since a transistor Q3 is ON and a transistor Q4 is OFF, so that the output current I obtained from the collector of a transistor Q10 is I=Io. The transistors Q5, Q6 and Q7 constitute a current mirror circuit, while the transistors Q8, Q9 and Q10 constitute another current mirror circuit. The same current flows through the transistors Q6, Q7, Q8 and Q10.

On the contrary, in the VHS mode, a current I1 flows through the transistor Q4 and a current (Io-I1) flows through the transistor Q6 since the transistor Q3 is OFF and the transistor Q4 is ON. Therefore, the output current I is I=Io-I1. As shown in FIG. 7, in a filter, the larger the current I is, the larger the current flowing through the dynamic resistance sections is. Thereby, the dynamic resistance decreases to increase the center frequency. For this reason, when I=Io (that is, in the SVHS mode), the total band of the changeover block 12 increases toward the high frequency side as shown by the solid line 27 in FIG. 4C. On the contrary, when I=Io-I1 (that is, in the VHS mode), frequency decreases, and the high frequency region decreases as shown by the dotted line 26 in FIG. 4C.

Figure 8:
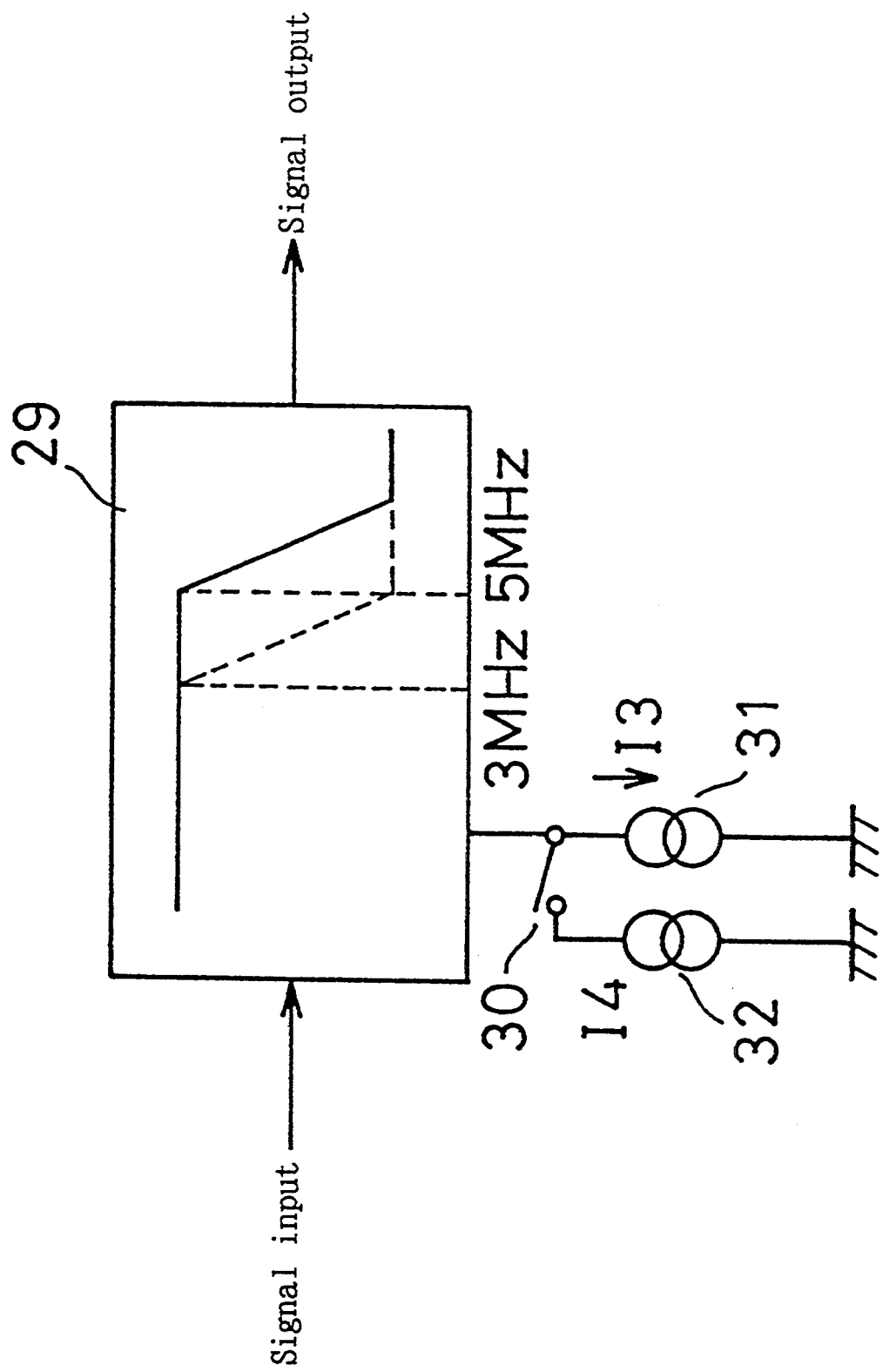
FIG. 8 is a simplified view of another embodiment of the present invention.

In VCRs, there are filters, other than the block 12 shown in FIGS. 2 and 3, whose characteristics are to be changed over between in the VHS mode and in the SVHS mode. For example, a low pass filter connected to the output side of a demodulator for luminance signals is one of them. FIG. 8 shows a low pass filter embodying the present invention. In the figure, a current to be supplied to an active filter 29 is changed over between a current I3 and a current (I3+I4) by a switch 30 to change over the characteristics of the active filter. The changeover circuit can also be constructed as shown in FIG. 6.

According to the above-described embodiment of the present invention, the area occupied by the active filter in the integrated circuit can be reduced to approximately ½ compared to the prior art of FIG. 1.

Obviously, many modifications and variations of the present invention are possible in light of the above teachings. It is therefore to be understood that within the scope of the appended claims, the invention may be practiced other than as specifically described.

What is claimed is:

1. An active filter characteristic changeover circuit for use in a video cassette recorder comprising:
   an active filter for a video signal, said active filter having parallel dynamic resistance sections each hving differentially connected transistors whose dynamic resistance is varied according to a value of a current flowing through the transistors thereby to vary a passing band width of the active filter;
   a current supply circuit for supplying the current;
   a changeover circuit for changing over the value of the current outputted from said current supply circuit between in a VHS mode and in an SVHS mode,
   wherein the transistors are activated in the VHS and SVHS modes so that the dynamic resistance thereof determines the passing band width.

2. An active filter characteristic changeover circuit according to claim 1, wherein said active filter, said current supply circuit and said changeover circuit are provided in a one-chip semiconductor integrated circuit.

3. An active filter characteristic changeover circuit according to claim 2, wherein said changeover circuit comprises a terminal to which different voltages are applied in the VHS mode and in the SVHS mode, respectively, and a switch device having an ON condition and an OFF condition which are determined according to a voltage applied to said terminal, and wherein a value of an output current from said current supply circuit is varied according to a condition of said switch device.

4. An active filter characteristic changeover circuit according to claim 1, wherein a video signal is inputted to a base of one of said transistors, and wherein a constant current source is connected to an emitter of said transistor, and wherein a current of the constant current source flows through the transistor and the current is changed by the changeover circuit.

5. A filter characteristic changeover circuit for use in video cassette recorder, comprising:
   a first filter having a fixed characteristic;
   a second filter having parallel dynamic resistance sections each hving differentially connected transistors said second filter being constituted by an active filter whose resistance value is dependent upon a value of a current through the transistors, said second filter being connected in series with the first filter wherein a characteristic of the second filter is combined with a characteristic of the first filter;
   current supplying means for supplying a current to the transistors of the second filter; and
   a changeover circuit for changing over a value of a current outputted from the current supplying means between in a VHS mode and in an SVHS mode.

* * * * *